United States Patent
Koya

(10) Patent No.: US 9,104,108 B2
(45) Date of Patent: Aug. 11, 2015

(54) HOLDER, LITHOGRAPHY APPARATUS, AND METHOD OF MANUFACTURING ARTICLE

(71) Applicant: CANON KABUSHIKI KAISHA, Tokyo (JP)

(72) Inventor: Shigeo Koya, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 0 days.

(21) Appl. No.: 14/225,655

(22) Filed: Mar. 26, 2014

(65) Prior Publication Data

US 2014/0295355 A1    Oct. 2, 2014

(30) Foreign Application Priority Data

Apr. 1, 2013    (JP) .................................. 2013-076459

(51) Int. Cl.
| | |
|---|---|
| G03F 7/20 | (2006.01) |
| B25B 11/00 | (2006.01) |
| H01L 21/683 | (2006.01) |
| H01L 21/687 | (2006.01) |

(52) U.S. Cl.
CPC ................ *G03F 7/20* (2013.01); *B25B 11/005* (2013.01); *G03F 7/707* (2013.01); *G03F 7/70716* (2013.01); *H01L 21/6838* (2013.01); *H01L 21/6875* (2013.01)

(58) Field of Classification Search
CPC . G03F 7/707; G03F 7/70716; G03F 7/70775; G03F 7/70758
USPC .................. 430/325; 355/72, 67, 30
See application file for complete search history.

(56) References Cited

U.S. PATENT DOCUMENTS

| 6,762,826 B2 | 7/2004 | Tsukamoto et al. |
| 6,809,802 B1 | 10/2004 | Tsukamoto et al. |
| 2004/0036850 A1 | 2/2004 | Tsukamoto et al. |
| 2013/0177857 A1* | 7/2013 | Shibazaki ..................... 430/325 |

FOREIGN PATENT DOCUMENTS

| JP | 2000286330 A | 10/2000 |
| JP | 2003332411 A | 11/2003 |
| JP | 2004-140071 A | 5/2004 |
| JP | 2007273693 A | 10/2007 |
| JP | 2009206455 A | 9/2009 |
| WO | 2011065386 A1 | 6/2011 |

OTHER PUBLICATIONS

Extended European Search Report issued in European counterpart application EP14162005.4, dated Sep. 23, 2014.

* cited by examiner

*Primary Examiner* — Caleen Sullivan
(74) *Attorney, Agent, or Firm* — Rossi, Kimms & McDowell LLP

(57) ABSTRACT

The present invention provides a holder for holding a substrate, the holder including a base to be received by a table, the base including a first surface arranged to receive the substrate to be held by the holder and a second surface opposite to the first surface, a first support provided on the second surface and arranged to surround a through hole formed in the base and configured to contact the table, a second support provided on the second surface and arranged to surround the first support and to contact the table, and a plurality of first pins provided in a region of the second surface between the second support and an outer edge of the base and arranged to contact the table.

10 Claims, 3 Drawing Sheets

F I G. 4
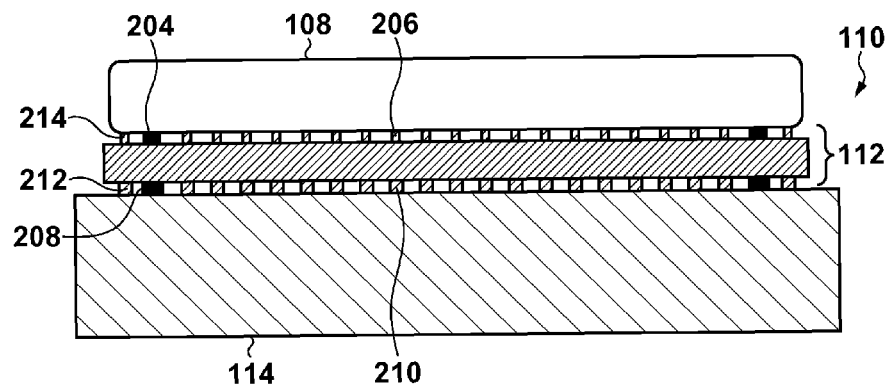
F I G. 5
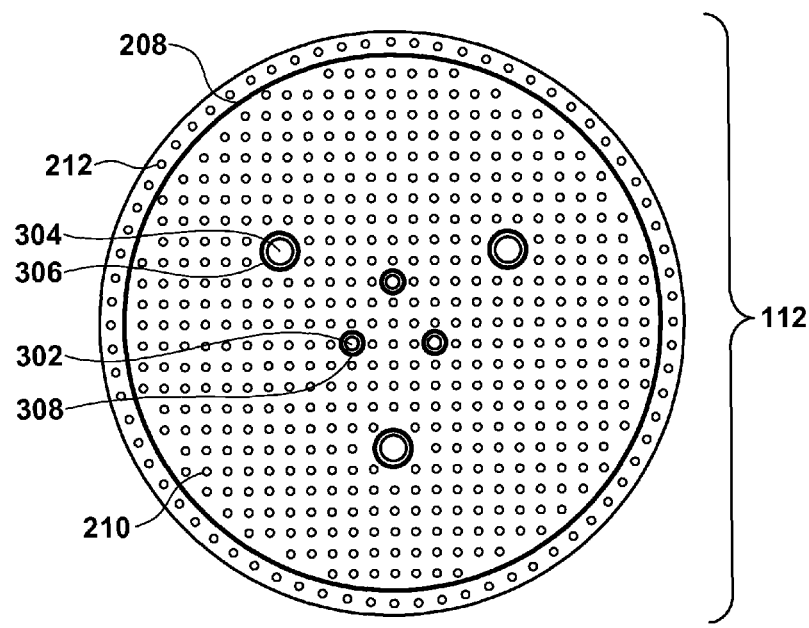

HOLDER, LITHOGRAPHY APPARATUS, AND METHOD OF MANUFACTURING ARTICLE

BACKGROUND OF THE INVENTION

1. Field of the Invention

The present invention relates to a holder, a lithography apparatus, and a method of manufacturing an article.

2. Description of the Related Art

Along with the advance of semiconductor devices toward higher density and micronization degree, exposure apparatuses used to manufacture them have raised the numerical aperture (NA) of the projection optical system. As the NA of the projection optical system rises, the resolving power of the exposure apparatus improves, but the effective depth of focus decreases. Hence, an exposure apparatus is required to hold a substrate with a high degree of flatness, and Japanese Patent Laid-Open No. 2004-140071 proposes a related technique.

In addition, to attain high productivity, the throughput of the exposure apparatus is enhanced and, for example, there is a need for a stage for holding a substrate which increases the acceleration. One method of implementing the high acceleration of the stage is to reduce the weight of the stage, and attempt to reduce the weight of a holder (chuck) that chucks and holds a substrate have been made.

However, as the holder is made thinner to reduce the weight of the stage, the rigidity of the holder itself lowers. Hence, flexture of the holder itself affects the plane correction performance of the substrate.

SUMMARY OF THE INVENTION

The present invention provides, for example, a holder which enhances the flatness of a substrate held thereby.

According to an aspect of the present invention there is provided a holder for holding a substrate, the holder including a base to be received by a table, the base including a first surface arranged to receive the substrate to be held by the holder and a second surface opposite to the first surface, a first support provided on the second surface and arranged to surround a through hole formed in the base and configured to contact the table, a second support provided on the second surface and arranged to surround the first support and to contact the table, and a plurality of first pins provided in a region of the second surface between the second support and an outer edge of the base and arranged to contact the table.

Further aspects of the present invention will become apparent from the following description of embodiments with reference to the attached drawings. Each of the embodiments of the present invention described below can be implemented solely or as a combination of a plurality of the embodiments or features thereof where necessary or where the combination of elements or features from individual embodiments in a single embodiment is beneficial.

BRIEF DESCRIPTION OF THE DRAWINGS

FIG. 4 is a sectional view showing the arrangement of a substrate stage according to the second embodiment.

FIG. 5 is a plan view showing the arrangement of the substrate stage according to the second embodiment.

DESCRIPTION OF THE EMBODIMENTS

Figure 1:
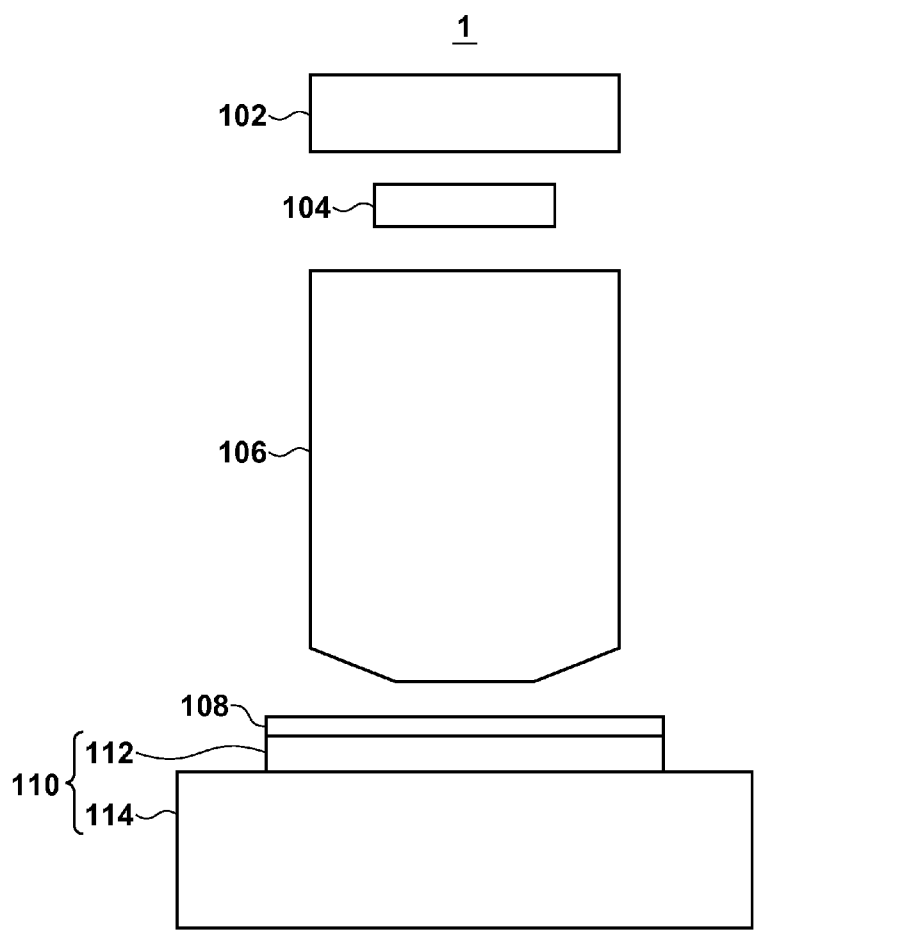
FIG. 1 is a schematic view showing the arrangement of a lithography apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of a lithography apparatus 1 according to an aspect of the present invention. The lithography apparatus 1 is an apparatus that forms (transfers) a pattern onto a substrate. In this embodiment, the lithography apparatus 1 is embodied as an exposure apparatus that exposes a substrate via a projection optical system and forms a pattern on the substrate. However, the lithography apparatus 1 is not limited to the exposure apparatus. For example, the lithography apparatus 1 may be a drawing apparatus that draws and forms a pattern on a substrate using a charged particle beam (for example, electron beam or ion beam) via a charged particle optical system. The lithography apparatus 1 may be an imprint apparatus that molds an imprint material (for example, resin) on a substrate using a mold and forms a pattern on the substrate.

As shown in FIG. 1, the lithography apparatus 1 includes an illumination optical system 102, a reticle stage (not shown) that hold a reticle 104, a projection optical system 106, and a substrate stage 110 that holds a substrate 108.

In the lithography apparatus 1, light from a light source (not shown) illuminates the reticle 104 held on the reticle stage via the illumination optical system 102. The light that has passed through the reticle 104 irradiates the substrate 108 via the projection optical system 106 (that is, the image of the pattern of the reticle 104 is formed on the substrate 108). The substrate stage 110 is a holding apparatus that can move while holding the substrate 108, and includes a holder (chuck) 112 and a stage table 114 on which the holder 112 is placed. Detailed arrangements of the substrate stage 110 will be described below in the respective embodiments.

First Embodiment

Figure 2:
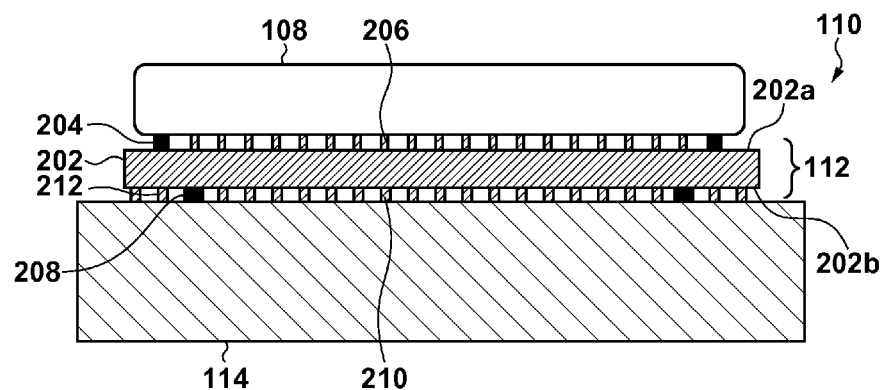
FIG. 2 is a sectional view showing the arrangement of a substrate stage according to the first embodiment.
Figure 3:
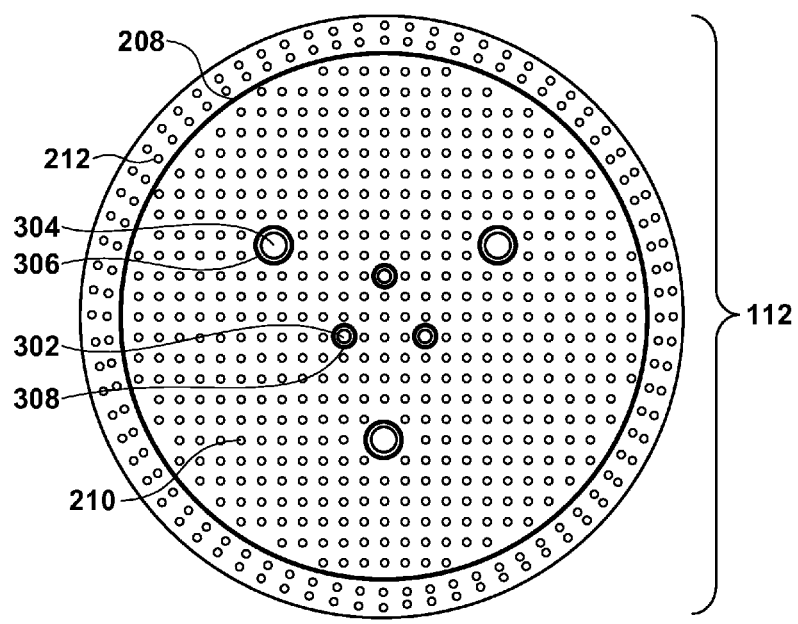
FIG. 3 is a plan view showing the arrangement of the substrate stage according to the first embodiment.

FIGS. 2 and 3 are views showing the arrangement of a substrate stage 110 according to the first embodiment of the present invention. FIG. 2 is a sectional view of the substrate stage 110, and FIG. 3 is a plan view of the second surface of a holder 112 of the substrate stage 110.

The holder 112 includes a base 202 that is made of a material having a high thermal conductivity, for example, SiC ceramic, and includes a first surface (front surface) 202a on the substrate side and a second surface (back surface) 202b on the side opposite to the first surface 202a. The base 202 has one or a plurality of substrate vacuum holes 302 as through holes extending through the base 202. A stage table 114 has substrate vacuum holes communicating with the substrate vacuum holes 302, which are connected to a vacuum source (not shown). The stage table 114 also has holder vacuum holes configured to chuck the holder 112, which are connected to a vacuum source (not shown).

To transport a substrate 108 to the holder 112 or collect the substrate 108 from the holder 112, lift pins (pins that chuck the substrate 108 and move up and down relative to the stage table 114) for transfer of the substrate 108 are necessary. Hence, lift pin holes 304 having a diameter larger than that of the lift pins are formed in the base 202 as through holes extending through the base 202.

Circumferential first holding portions (not shown) that surround the lift pin holes 304 through the perimeter and a circumferential second holding portion 204 that surrounds the first holding portions are formed on the first surface 202a of the base 202 to chuck (hold) the substrate 108. The second holding portion 204 seals the space between the substrate 108 and the first surface 202a of the base 202. The first holding portions and the second holding portion 204 contact the substrate 108 and define a substrate holding plane that holds the substrate 108. The second holding portion 204 is formed in a region of the first surface 202a between the outer edge of the base 202 and a projection region where a second support portion 208 formed on the second surface 202b of the base 202 is projected to the first surface 202a of the base 202. In other words, the second holding portion 204 is formed between the outer edge of the base 202 and the region of the first surface 202a above the second support portion 208. In this embodiment, the second holding portion 204 is the member formed at the outermost position out of the members that are formed on the first surface 202a of the base 202 and contact the substrate 108. Additionally, the second holding portion 204 is formed to have a diameter smaller than that of the substrate 108. A plurality of pins (pin-shaped projections) 206 that contact the substrate 108 are formed in the region of the first surface 202a surrounded by the second holding portion 204, more specifically, in the region of the first surface 202a between the second holding portion 204 and the first holding portions. The plurality of pins 206 also define the substrate holding plane that holds the substrate 108 together with the first holding portions and the second holding portion 204. The first holding portions, the second holding portion 204, and the pins 206 thus define the substrate holding plane. This makes it possible to hold the substrate 108 while maintaining a high flatness when vacuum-chucking the substrate 108.

Circumferential support portions 306 that surround the lift pin holes 304 through the perimeter and circumferential support portions 308 that surround the substrate vacuum holes 302 through the perimeter are formed on the second surface 202b of the base 202 to chuck (hold) the substrate 108. The support portions 306 and 308 constitute first support portions that surround the through holes extending through the base 202 through the perimeter. The circumferential second support portion 208 is also formed on the second surface 202b of the base 202 so as to surround the support portions 306 and 308 as the first support portions. The support portions 306 and 308 and the second support portion 208 contact the stage table 114. A plurality of pins (pin-shaped projections) 210 that contact the stage table 114 are formed in the region of the second surface 202b surrounded by the second support portion 208, more specifically, in the region of the second surface 202b between the second support portion 208 and the support portions 306 and 308 (first support portions). The support portions 306 and 308 and the second support portion 208 thus contact the stage table 114. This makes it possible to maintain the flatness of the holder 112 when vacuum-chucking the substrate 108 or the holder 112.

In addition, a plurality of second surface-side pins 212 that contact the stage table 114 are formed outside the second support portion 208, that is, in the region of the second surface 202b between the outer edge of the base 202 and the second support portion 208. This makes it possible to suppress flexture caused by the weight of the outer edge (outer periphery) of the holder 112, which becomes more conspicuous as the holder 112 is made thinner, and reduce deformation of the holder 112. Hence, even when the holder 112 is made thinner, a decrease in the flatness of the holder 112 (plane correction performance of the substrate 108) can be suppressed. It is therefore possible to hold the substrate 108 while maintaining a high flatness.

Second Embodiment

FIGS. 4 and 5 are views showing the arrangement of a substrate stage 110 according to the second embodiment of the present invention. FIG. 4 is a sectional view of the substrate stage 110, and FIG. 5 is a plan view of the second surface of a holder 112 of the substrate stage 110.

In the holder 112 of this embodiment, a plurality of first surface-side pins 214 that contact a substrate 108 are formed outside a second holding portion 204, that is, in the region of a first surface 202a between the second holding portion 204 and the outer edge of a base 202, in addition to the features described in the first embodiment.

Additionally, in this embodiment, the second holding portion 204 overlaps a projection region where a second support portion 208 is projected from the second surface side to the first surface side of the base 202. In other words, the second holding portion 204 is formed so as to at least partially overlap the second support portion 208 on the second support portion 208. Especially in FIG. 4, the second holding portion 204 is formed so as to fit within the second support portion 208 (not to lie off the second support portion 208) on the second support portion 208. Hence, the width of the second holding portion 204 is smaller than that of the second support portion 208.

In this embodiment, the first surface-side pins 214 overlap projection regions where second surface-side pins 212 are projected from the second surface side to the first surface side of the base 202. In other words, each of the first surface-side pins 214 is formed so as to at least partially overlap a corresponding one of the second surface-side pins 212 on the second surface-side pin. Especially in FIG. 4, each of the first surface-side pins 214 is formed so as to fit within a corresponding one of the second surface-side pins 212 (not to lie off the one second surface-side pin) on the second surface-side pin. Hence, the width of the first surface-side pin 214 is smaller than that of the second surface-side pin 212.

With this arrangement, in this embodiment, the second support portion 208 can be formed on the second surface 202b of the base 202 on the outer side as compared to the first embodiment. It is therefore possible to suppress flexture of the outer edge portion of the holder 112 caused by making the holder 112 thinner and further reduce deformation of the holder 112.

As described above, in this embodiment, the second surface-side pins 212 that are formed outside the second support portion 208 contact a stage table 114, and additionally, the first surface-side pins 214 that contact the substrate 108 are formed coaxially to the second surface-side pins 212. This makes it possible to correct deformation of the holder 112 due to flexture caused by the weight of the outer edge of the holder 112, which becomes more conspicuous as the holder 112 is made thinner, flexture caused by the weight of the outer edge portion of the substrate 108, and a droop of the outer periphery of the substrate 108. It is therefore possible to hold the substrate 108 while maintaining a high flatness.

In the first and second embodiments, the second surface-side pins 212 and the first surface-side pins 214 can have various shapes and forms. For example, the second surface-side pins 212 and the first surface-side pins 214 can have a circular, square, rectangular, triangular, or elliptical shape, or a conical or cylindrical form.

As described above, the lithography apparatus 1 can suppress flexure caused by the weight of the holder 112 and prevent the substrate holding performance and the plane correction performance from lowering even when the holder 112 is made thinner. For this reason, both high throughput and improvement of overlay performance can simultaneously be achieved. Hence, the lithography apparatus 1 can provide an article such as a quality device economically with high throughput.

A method of manufacturing an article according to an embodiment of the present invention is suitable for manufacturing an article, for example, a micro device such as a semiconductor device or an element having a fine structure. This manufacturing method includes a step of forming a pattern on a substrate with a photoresist applied on it using the lithography apparatus 1, and a step of processing (for example, developing) the substrate on which the pattern is formed. Following the forming step, the manufacturing method can include other known processes (for example, oxidation, deposition, vapor deposition, doping, planarization, etching, resist peeling, dicing, bonding, and packaging). The method of manufacturing the article according to the embodiment is advantageous in at least one of the performance, quality, productivity, and production cost of the article, as compared to conventional methods.

Note that the present invention is applicable not only to a lithography apparatus but also to another apparatus (for example, measurement apparatus) including a holder and a stage table.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-076459 filed on Apr. 1, 2013, which is hereby incorporated by reference herein in its entirety.

What is claimed is:

1. A holder for holding a substrate, the holder comprising:
a base including a first surface arranged to receive the substrate to be held by the holder, a second surface opposite to the first surface, and a through hole;
a first support disposed on the second surface and arranged to surround the through hole and configured to contact a table;
a second support having a continuously circumferential shape disposed on the second surface and arranged to surround the first support and to contact the table; and
a plurality of first pins disposed in a region of the second surface between the second support and an outer edge of the base and arranged to contact the table.

2. The holder according to claim 1, further comprising:
a holding portion disposed on the first surface and arranged to seal a space between the first surface and a substrate to be held by the holder,
wherein the holding portion is arranged to at least partially concentrically overlap the second support.

3. The holder according to claim 2, wherein the holding portion is arranged such that the holding portion wholly overlaps the second support.

4. The holder according to claim 2, further comprising:
a plurality of second pins disposed in a region of the first surface between the holding portion and the outer edge of the base and arranged to contact the substrate to be held,
wherein each of the plurality of second pins is arranged to at least partially overlap corresponding one of the plurality of first pins on the second surface.

5. The holder according to claim 4, wherein each of the plurality of second pins is arranged to wholly overlap corresponding one of the plurality of first pins.

6. The holder according to claim 1, further comprising:
a holding portion on the first surface and arranged to seal a space between the first surface and the substrate to be held,
wherein the holding portion is disposed in a region of the first surface between the outer edge of the base and a region of the first surface above the second support.

7. The holder according to claim 6, wherein the holding portion is the outermost portion of all portions disposed on the first surface and arranged to contact the substrate to be held.

8. A lithography apparatus for forming a pattern on a substrate, the apparatus comprising a holder to hold the substrate, the holder comprising:
a base including a first surface arranged to receive the substrate to be held by the holder, a second surface opposite to the first surface, and a through hole;
a first support disposed on the second surface and arranged to surround the through hole and configured to contact a table;
a second support having a continuously circumferential shape disposed on the second surface and arranged to surround the first support and to contact the table; and
a plurality of first pins disposed in a region of the second surface between the second support and an outer edge of the base and arranged to contact the table.

9. The apparatus according to claim 8, further comprising:
a projection optical system,
wherein a pattern is formed on the substrate to be held by exposing the substrate to a beam of radiation via the projection optical system.

10. A method of manufacturing an article, the method comprising:
forming a pattern on a substrate using a lithography apparatus; and
processing the substrate on which the pattern has been formed to manufacture the article,
wherein the lithograph apparatus includes a holder configured to hold the substrate, and
wherein the holder includes:
a base including a first surface arranged to receive the substrate to be held by the holder, a second surface opposite to the first surface, and a through hole;
a first support disposed on the second surface and arranged to surround the through hole and configured to contact a table;
a second support having a continuously circumferential shape disposed on the second surface and arranged to surround the first support and to contact the table; and
a plurality of first pins disposed in a region of the second surface between the second support and an outer edge of the base and arranged to contact the table.

* * * * *